United States Patent
Kirii et al.

(10) Patent No.: US 8,540,818 B2
(45) Date of Patent: Sep. 24, 2013

(54) POLYCRYSTALLINE SILICON REACTOR

(75) Inventors: Seiichi Kirii, Taki-gun (JP); Teruhisa Kitagawa, Suzuka (JP)

(73) Assignee: Mitsubishi Materials Corporation, Tokyo (JP)

( * ) Notice: Subject to any disclaimer, the term of this patent is extended or adjusted under 35 U.S.C. 154(b) by 721 days.

(21) Appl. No.: 12/662,597

(22) Filed: Apr. 26, 2010

(65) Prior Publication Data

US 2010/0269754 A1     Oct. 28, 2010

(30) Foreign Application Priority Data

Apr. 28, 2009 (JP) ................. 2009-110149

(51) Int. Cl.
C23C 16/458 (2006.01)
C23C 16/46 (2006.01)
C23F 1/00 (2006.01)
H01L 21/306 (2006.01)
C23C 16/06 (2006.01)

(52) U.S. Cl.
USPC ........... 118/726; 118/724; 118/725; 118/728; 156/345.51; 156/345.52; 156/345.53

(58) Field of Classification Search
USPC 118/724–726, 728, 715; 156/345.51–345.53
See application file for complete search history.

(56) References Cited

U.S. PATENT DOCUMENTS

| | | | | |
|---|---|---|---|---|
| 3,011,877 A * | 12/1961 | Reuschel et al. | ............. | 422/199 |
| 3,099,534 A * | 7/1963 | Schweickert et al. | ........ | 423/346 |
| 3,147,141 A * | 9/1964 | Ishizuka | ........................ | 118/724 |
| 3,152,933 A * | 10/1964 | Reuschel | ....................... | 438/460 |
| 3,168,422 A * | 2/1965 | Allegretti et al. | ............... | 117/93 |
| 3,358,638 A * | 12/1967 | Rummel | ........................ | 118/725 |
| 3,558,351 A * | 1/1971 | Foster | ..................... | 204/192.25 |
| 3,594,227 A * | 7/1971 | Oswald | ........................ | 438/782 |
| 3,659,552 A * | 5/1972 | Briody | ........................... | 118/725 |
| 3,663,319 A * | 5/1972 | Rose | ............................... | 117/96 |
| 3,717,439 A * | 2/1973 | Sakai | ............................. | 118/715 |
| 3,918,396 A * | 11/1975 | Dietze et al. | ................... | 118/725 |
| 4,023,520 A * | 5/1977 | Reuschel | ....................... | 118/665 |
| 4,063,972 A * | 12/1977 | Akai et al. | ........................ | 117/61 |
| 4,147,814 A * | 4/1979 | Yatsurugi et al. | ............. | 427/588 |
| 4,150,168 A * | 4/1979 | Yatsurugi et al. | ............. | 427/588 |
| 4,173,944 A * | 11/1979 | Koppl et al. | ................... | 118/719 |
| 4,179,530 A * | 12/1979 | Koppl et al. | ................... | 427/545 |
| 4,311,545 A * | 1/1982 | Bugl et al. | ...................... | 117/102 |
| 4,367,768 A * | 1/1983 | Schulke | ....................... | 137/527.6 |
| 4,446,817 A * | 5/1984 | Crawley | ........................ | 118/725 |
| 4,632,058 A * | 12/1986 | Dixon et al. | ................... | 118/725 |
| 4,641,603 A * | 2/1987 | Miyazaki et al. | ............. | 118/724 |

(Continued)

FOREIGN PATENT DOCUMENTS

JP    56-114815 A    9/1981
JP    57155366 A *   9/1982

(Continued)

*Primary Examiner* — Rudy Zervigon

(74) *Attorney, Agent, or Firm* — Edwards Wildman Palmer LLP

(57) ABSTRACT

A polycrystalline silicon reactor in which the polycrystalline silicon is deposited by supplying raw-material gas to a heated silicon seed rod has; a bottom plate on which the silicon seed rod stands, having a dished upper surface; an opening of a path penetrating the bottom plate from the upper surface to a lower surface, being provided at a lowest part of the upper surface; and a plug which is detachably attached to the opening.

7 Claims, 6 Drawing Sheets

(56) References Cited

U.S. PATENT DOCUMENTS

| | | | |
|---|---|---|---|
| 4,694,779 A * | 9/1987 | Hammond et al. | 118/730 |
| 4,715,317 A * | 12/1987 | Ishizuka | 118/719 |
| 4,724,160 A * | 2/1988 | Arvidson et al. | 438/466 |
| 4,805,556 A * | 2/1989 | Hagan et al. | 118/725 |
| 5,062,386 A * | 11/1991 | Christensen | 118/725 |
| 5,108,512 A * | 4/1992 | Goffnett et al. | 134/7 |
| 5,653,808 A * | 8/1997 | MacLeish et al. | 118/715 |
| 5,888,303 A * | 3/1999 | Dixon | 118/715 |
| 6,001,175 A * | 12/1999 | Maruyama et al. | 117/102 |
| 6,099,650 A * | 8/2000 | Carbonaro et al. | 118/715 |
| 6,221,155 B1 * | 4/2001 | Keck et al. | 117/200 |
| 6,365,225 B1 * | 4/2002 | Chandra et al. | 427/237 |
| 6,436,796 B1 * | 8/2002 | Mailho et al. | 438/478 |
| 6,544,333 B2 * | 4/2003 | Keck et al. | 117/200 |
| 6,736,901 B2 * | 5/2004 | Nishibayashi | 118/666 |
| 6,749,824 B2 * | 6/2004 | Dawson et al. | 423/348 |
| 7,395,779 B2 * | 7/2008 | Ishii et al. | 118/723 MW |
| 8,282,902 B2 * | 10/2012 | Tebakari | 423/342 |
| 2003/0141018 A1 * | 7/2003 | Stevens et al. | 156/345.51 |
| 2009/0130333 A1 * | 5/2009 | Kim et al. | 427/545 |
| 2009/0238992 A1 * | 9/2009 | Endoh et al. | 427/543 |
| 2009/0297708 A1 * | 12/2009 | Tebakari | 427/255.17 |
| 2009/0314207 A1 * | 12/2009 | Endoh et al. | 118/723 R |
| 2010/0055007 A1 * | 3/2010 | Ishii | 422/199 |
| 2010/0058988 A1 * | 3/2010 | Endoh et al. | 118/725 |
| 2010/0229796 A1 * | 9/2010 | Endoh et al. | 118/728 |
| 2010/0269754 A1 * | 10/2010 | Kirii et al. | 118/725 |
| 2011/0014468 A1 * | 1/2011 | Urushihara et al. | 428/398 |
| 2011/0036292 A1 * | 2/2011 | Dehtiar et al. | 118/723 E |
| 2011/0036294 A1 * | 2/2011 | Hillabrand et al. | 118/723 R |
| 2011/0052914 A1 * | 3/2011 | Urushihara et al. | 428/392 |
| 2011/0318909 A1 * | 12/2011 | Gum et al. | 438/488 |
| 2012/0192791 A1 * | 8/2012 | Hillabrand et al. | 118/723 E |
| 2012/0199068 A1 * | 8/2012 | Hillabrand et al. | 118/723 E |
| 2012/0222619 A1 * | 9/2012 | Netsu et al. | 118/723 R |

FOREIGN PATENT DOCUMENTS

| | | | |
|---|---|---|---|
| JP | 61086494 A | * | 5/1986 |
| JP | 61136676 A | * | 6/1986 |
| JP | 62117318 A | * | 5/1987 |

\* cited by examiner

POLYCRYSTALLINE SILICON REACTOR

BACKGROUND OF THE INVENTION

1. Field of the Invention

The present invention relates to a polycrystalline silicon reactor which is used for producing polycrystalline silicon by the Siemens process.

Priority is claimed on Japanese Patent Application No. 2009-110149, filed Apr. 28, 2009, the content of which is incorporated herein by reference.

2. Description of the Related Art

The Siemens process is known as a producing process of the high-purity polycrystalline silicon that is raw-material of a semiconductor. The Siemens process is a producing process in which raw-material gas including a mixture of chlorosilane gas and hydrogen gas is in contact with heated silicon seed rods so that polycrystalline silicon may be deposited on the silicon seed rods by thermal decomposition and hydrogen reduction. As an apparatus for carrying out this process, a polycrystalline silicon reactor in which a plurality of silicon seed rods stand in a reactor is used.

When polycrystalline silicon is produced in the polycrystalline silicon reactor, chlorosilane polymer which is a by-product of the thermal decomposition and the hydrogen reduction condenses and sticks to a chilled inner-wall surface and a chilled floor surface of the reactor. In an exhaust gas of the reaction, unreacted raw-material gas, and hydrogen chloride gas are included with silicon powder and by-products such as silicon tetrachloride, polymer compound, and the like. The polymer compound such as chlorosilane polymer may ignite in air or may hydrolyze by moisture in the air, and hydrogen chloride may be generated. Therefore, before taking the deposited polycrystalline silicon out of the reactor, it is necessary to inactivate the polymer after the reactor is filled with inert gas.

As a process for inactivating the polymer, a process of heating and hydrolyzing accretion accreting to the inner-wall of the reactor by heating the reactor wall of the polycrystalline silicon reactor and introducing humidity controlled-gas into the reactor is described in Japanese Unexamined Patent Application, First Publication No. S56-114815 (Patent Document 1).

By hydrolyzing the polymer in the polycrystalline silicon reactor as abovementioned, silica, which is inert material, is generated. Therefore, the Patent Document 1 describes a process of removing and discharging the accretion of the inner-wall surface after dismounting a bell jar from a bottom plate and placing the bell jar on a table. On the other hand, since the bottom plate is provided with a plurality of protruded electrodes, nozzles for introducing or exhausting gas, and the like, it is a complex operation to clean the upper surface of the bottom plate. Therefore, it is required to clean the reactor efficiently.

SUMMARY OF THE INVENTION

The present invention is achieved in consideration of the above circumstances, and has an object to provide a polycrystalline silicon reactor in which the upper surface of the bottom plate of the reactor can be cleaned efficiently.

In order to achieve the object, the present invention is a polycrystalline silicon reactor in which the polycrystalline silicon is deposited by supplying raw-material gas to a heated silicon seed rod. The polycrystalline silicon reactor of the present invention has a bottom plate on which the silicon seed rod stands. The bottom plate has a dished upper surface. The polycrystalline silicon reactor of the present invention further has an opening of a path penetrating the bottom plate from the upper surface to a lower surface, and a plug which is detachably attached to the opening. The path is provided at a lowest part of the upper surface.

According to the polycrystalline silicon reactor, since the upper surface of the bottom plate is depressed so as to be dished, and the opening of the path is provided at the lowest part of the upper surface, water and the like to clean the reactor can be discharged efficiently through the path while washing the reactor. Furthermore, by attaching the plug to the opening, the path can be closed during the reaction process.

In the polycrystalline silicon reactor, it is preferable that the plug have a protruded portion which protrudes from the upper surface of the bottom plate, and a through hole opening at an upper surface of the protruded portion and connecting the path to an inner of the reactor. In this case, raw-material gas such as hydrogen gas can be supplied into the reactor through the through hole of the plug. During the reaction process, by-products such as polymers condense on the bottom plate, and may flow toward the opening of the path of the bottom plate. However, since the protruded portion is formed at the plug, so that the path is open at higher portion than the upper surface of the bottom plate, then the polymers can be prevented from flowing into the path. Moreover, when cleaning the reactor, since the path is open at the lowest portion of the upper surface of the bottom plate, the water on the bottom plate can be discharged smoothly.

In the polycrystalline silicon reactor, it is preferable that a sloped annular portion which is higher than the upper surface of the bottom plate be provided at an outer peripheral part of the bottom plate along a circumferential direction. The sloped annular portion includes not only an inclined surface but also a vertical surface. Furthermore, it is preferable that the plug be formed so that the upper surface of the protruded portion is higher at least than a top end of the sloped annular portion in a state in which the plug is attached to the opening. In the case in which the sloped annular portion along the circumferential direction is provided so as to rise from the outer peripheral portion of the bottom plate, the water can be prevented from overflowing the bottom plate. Further when cleaning the upper surface of the bottom plate as attaching the plug, the water can be impounded within a surrounded part by the sloped annular portion while cleaning the upper surface of the bottom plate. Furthermore, when the upper surface of the plug is located above the sloped annular portion, the by-products of the reaction sticking on the upper surface of the bottom plate can be prevented from flowing into the path through the through hole of the plug. In addition, thermal influence of the radiation heat to a gasket airproofing between the bell-jar and the bottom plate from the upper surface during the reaction can be reduced.

In the polycrystalline silicon reactor, the plug is preferable to be made of carbon. In this case, metallic contamination and the like during the reaction process can be prevented. Furthermore, since carbon can be reused after purifying, the plug can be used more than once.

In the polycrystalline silicon reactor, it is preferable that the path be connected to a raw-material gas supply source which supplies the raw-material gas. In this case, since the raw-material gas flows through the path into the reactor, the high-temperature gas can be prevented from inflowing into the path from the reactor, and the plug which is heated by the high temperature in the reactor can be cooled by the raw-material gas flowing along the path.

In order to prevent the gas from flowing into the path from the reactor during the reaction process, a plug may be attached so as to close the path. However, if the plug is made of stainless-steel and is not chilled directly, the metal contamination during the reaction process may be occurred. Therefore, the plug is necessary to be made of carbon, SiC or the like. However, it is difficult to surely seal the path by the plug which is made of a material having a different coefficient of thermal expansion from that of the reactor which is made of stainless-steel. On the other hand, according to the present invention in which the raw-material gas is introduced into the path through the path, the gas can be surely prevented from flowing into the path during the reaction process.

In the polycrystalline silicon reactor, a cylindrical coolant path surrounding the outer peripheral of the path may further be provided. In this case, since the path is cooled, contaminations from a pipe forming the path can be prevented.

According to the polycrystalline silicon reactor of the present invention, since the inclined plane descending toward the opening of the path is formed at the bottom plate, the water or the like can be easily discharged through the path, so that the polymers, silica (i.e., silicon dioxide) and the like which stick to the upper surface of the bottom plate can be easily removed.

DETAILED DESCRIPTION OF THE INVENTION

Figure 1:
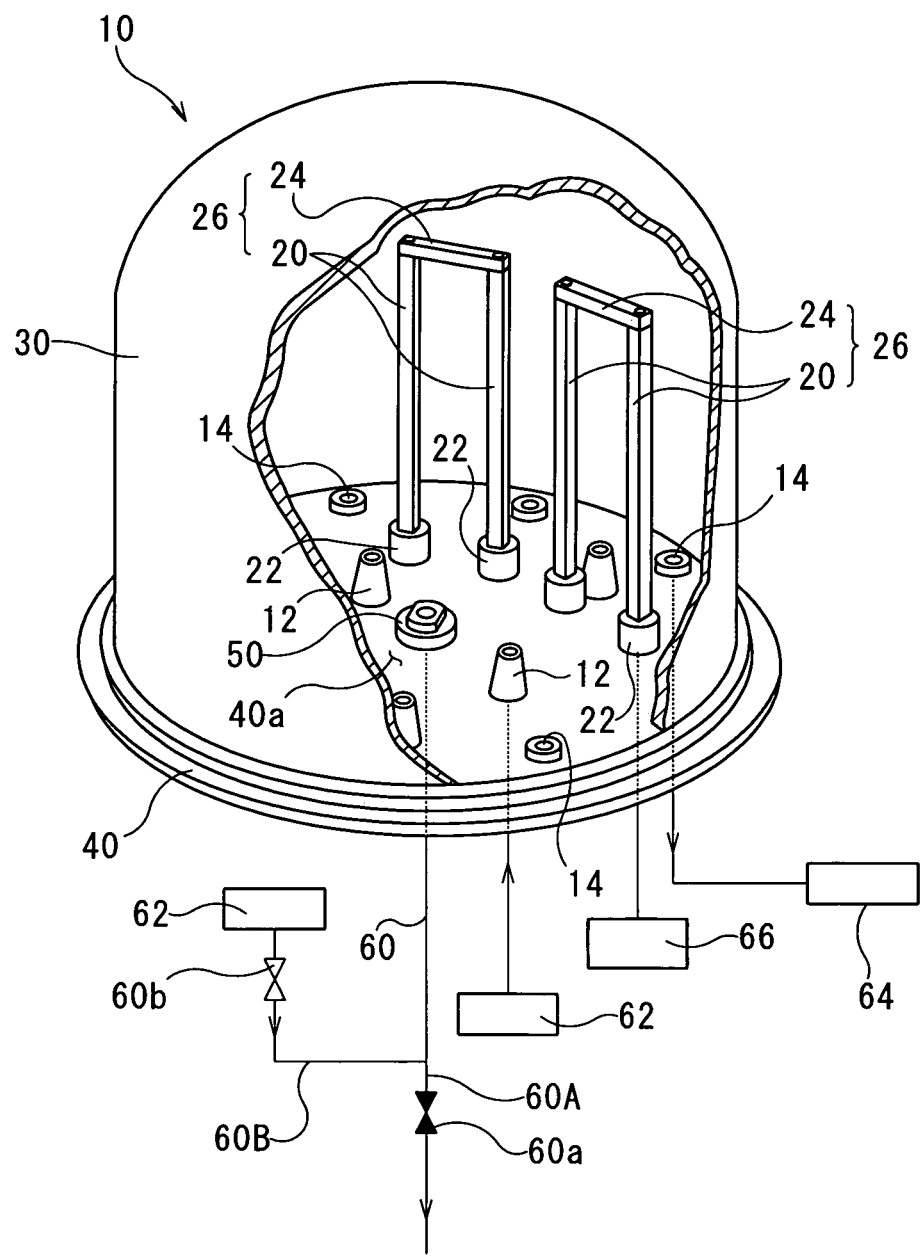
FIG. 1 is a perspective view showing the polycrystalline silicon reactor according to the present invention.

An embodiment of a polycrystalline silicon reactor according to the present invention will be described below. The polycrystalline silicon reactor (hereinafter, "reactor") 10 is an apparatus for depositing polycrystalline silicon by supplying raw-material gas to surfaces of heated silicon seed rods 20. As shown in FIG. 1, the reactor 10 is provided with a bell-jar 30 covering the silicon seed rods 20, and a bottom plate 40 in which the bell jar 30 is detachably attached to and the silicon seed rods 20 are mounted.

The bottom plate 40 is provided with electrode units 22 to which the silicon seed rods 20 are fixed, ejection nozzles (i.e., gas supply port) 12 which eject the raw-material gas including chlorosilane gas and hydrogen gas into the reactor 10, and gas discharge ports 14 discharging gas to the outside of the reactor 10. The ejection nozzles 12 are mounted throughout an upper surface 40a of the bottom plate 40 with suitable intervals so as to supply the raw-material gas uniformly to the silicon seed rods 20. The ejection nozzles 12 are connected to a raw-material gas supply source 62 which is located outside the reactor 10. The gas discharge ports 14 are formed with appropriate intervals along the circumferential direction in the vicinity of the outer peripheral portion of the upper surface 40a of the bottom plate 40, and are connected to an exhaust gas treatment system 64 which are located outside the reactor 10. The electrode units 22 are connected to a power circuit 66.

Each of the silicon seed rods 20 is fixed with lower end of the silicon seed rod 20 being inserted into the electrode unit 22, and stands upward from the bottom plate 40. A connecting member 24 being made of the same silicon as the silicon seed rods 20 and connecting two silicon seed rods 20 as a pair is attached on the top end of each of the silicon seed rods 20. Two silicon seed rods 20 and the connecting member 24 connecting the silicon seed rods 20 construct a seed assembly 26 having II-shape. The seed assemblies 26 are arranged in substantially a concentric pattern since the electrode units 22 are arranged in a concentric pattern around the center of the reactor 10.

The electrode units 22 are connected with each other so that the silicon seed rods 20 and the connecting member 24 are connected in series. The power circuit 66 is connected to both electrode units 22 of the ends of the series, and supplies the electricity to these electrode units 22 of the end of the series. The silicon seed rods 20 and the connecting members 24 are electrified, and heated by electrical resistance to high temperature. The raw-material gas is supplied from the ejection nozzles 12 and in contact with the high-temperature surfaces of the silicon seed rods 20 and the connecting members 24, so that the polycrystalline silicon is deposited on the surfaces of the silicon seed rods 20 and the connecting member 24 by thermal decomposition and hydrogen reduction.

The bell jar 30 has a hanging-bell shape and is attached to the bottom plate 40 so as to form a reaction space in which an inner space thereof is the highest at the center and the lowest at the outer peripheral portion. The bell jar 30 has a jacket structure (the illustration is omitted) in which coolant is circulated. The reactor wall of the bell jar 30 is cooled by the coolant.

The bottom plate 40 is formed in a recessed shape so that the upper surface 40a descends toward the center thereof. The bottom plate 40 has a jacket structure in which substantially a disc-shape floor space 42 is formed therein. The floor space 42 is provided with a water supply-port 42a which opens at a lower surface 40b of the bottom plate 40, and a water discharge-port 42b which opens at a side surface 40c of the bottom plate 40. The coolant is supplied from a water supply equipment (not illustrated) through the water supply-port 42a to the floor space 42, and is discharged outside the reactor 10 through the water discharge-port 42b, thereby cooling the upper surface 40a. Note, the seed assemblies 26, ejection nozzles 12, gas discharge port 14, and the like are omitted from FIG. 2.

Figure 6:
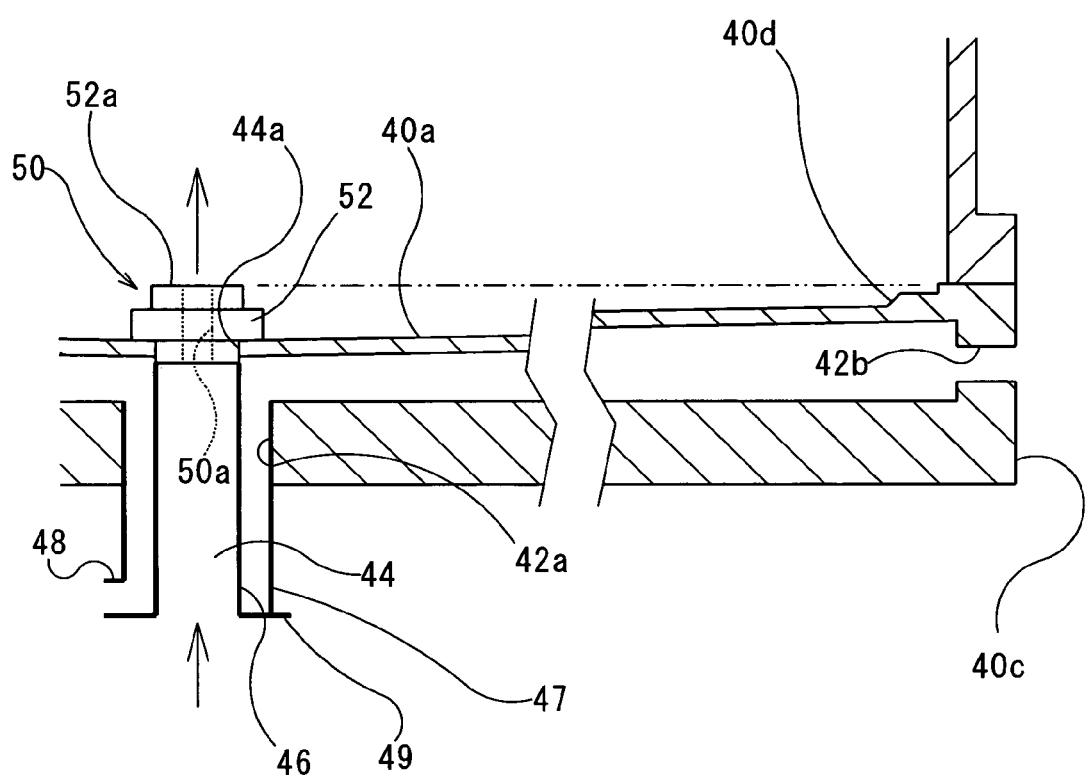
FIG. 6 is a partially magnification showing the forms of the sloped annular portion and the plug in the polycrystalline silicon reactor according to the-present invention.

An opening 44a of the path 44 penetrating the bottom plate 40 vertically is formed at the center of the upper surface 40a, i.e., the lowest part thereof That is, the bottom plate 40 is an inclined surface ascending from the center opening 44a toward the outer circumference in an inclined angle of substantially 1° with respect to the horizontal. A sloped annular portion 40d is circularly formed along the circumferential direction of the bottom plate 40 so as to be connected to the outer peripheral portion of the bottom plate 40 and stand upward (refer to FIG. 6). The sloped annular portion 40d includes not only an inclined surface but also a vertical surface. The path 44 is used for supplying the raw-material gas into the reactor 10 or discharging the water from the reactor 10. To the opening 44a of the path 44, a detachable plug 50 is provided.

Figure 3:
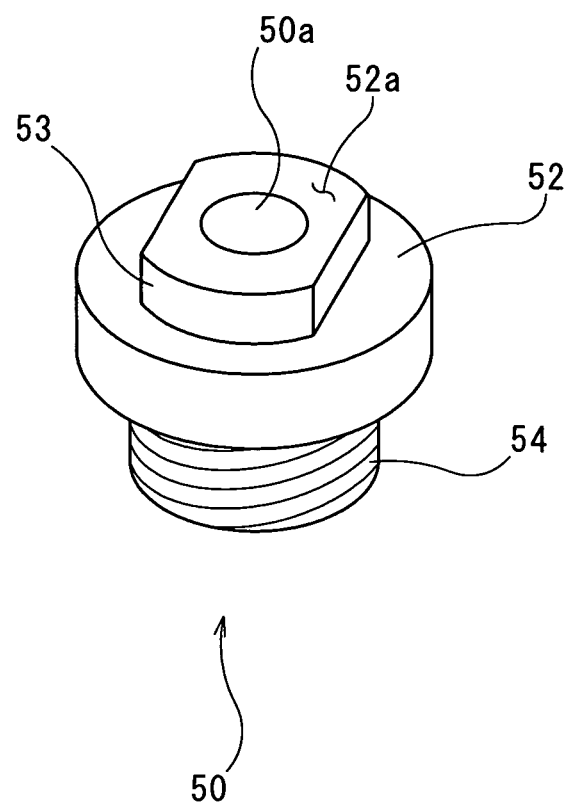
FIG. 3 is a perspective view showing the plug which is attached to the polycrystalline silicon reactor of FIG. 1.
Figure 4:
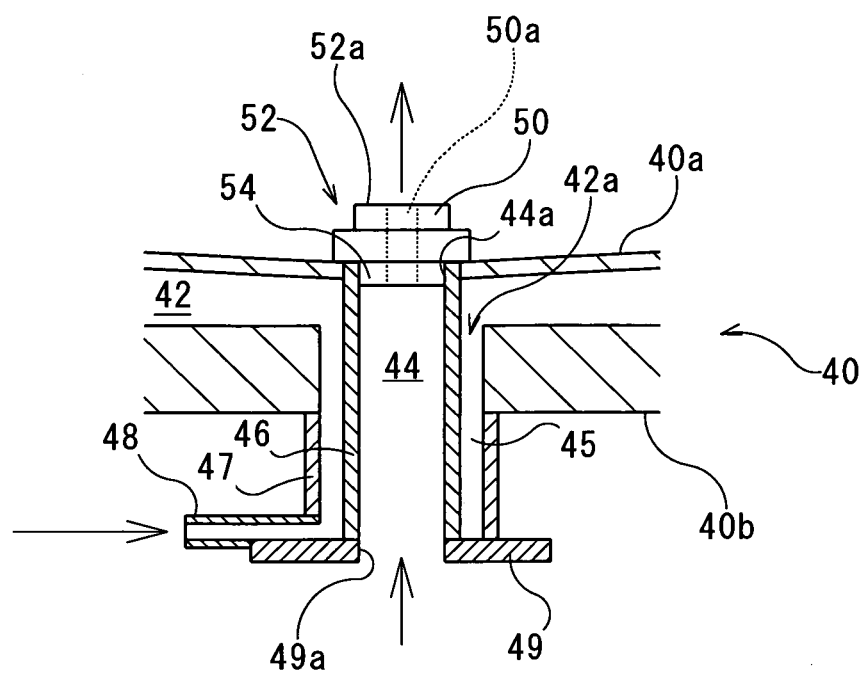
FIG. 4 is a sectional view showing the vicinity of the path of the bottom plate during the reaction process in the polycrystalline silicon reactor of FIG. 1.

The plug 50 is made of carbon, and has a protruded part 52 protruding from the upper surface 40a of the bottom plate 40 and a male thread part 54 which is threaded to the female thread (not illustrated) which is formed at the upper end portion of the path 44, as shown in FIG. 3 and FIG. 4. In the plug 50, a through hole 50a which opens at an upper surface 52a of the protruded part 52 and connects the inside of the reactor 10 with the inside of the path 44 is formed. Therefore, the path 44 can be open at the higher position than the upper surface 40a of the bottom plate 40 by attaching the plug 50 to the opening 44a of the path 44. The plug 50 is formed so that the upper surface 52a of the protruded portion 52 is higher than the upper end of the sloped annular portion 40d which is provided at the outer peripheral part of the bottom plate 40 in a state in which the plug 50 is attached to the opening 44a.

Figure 5:
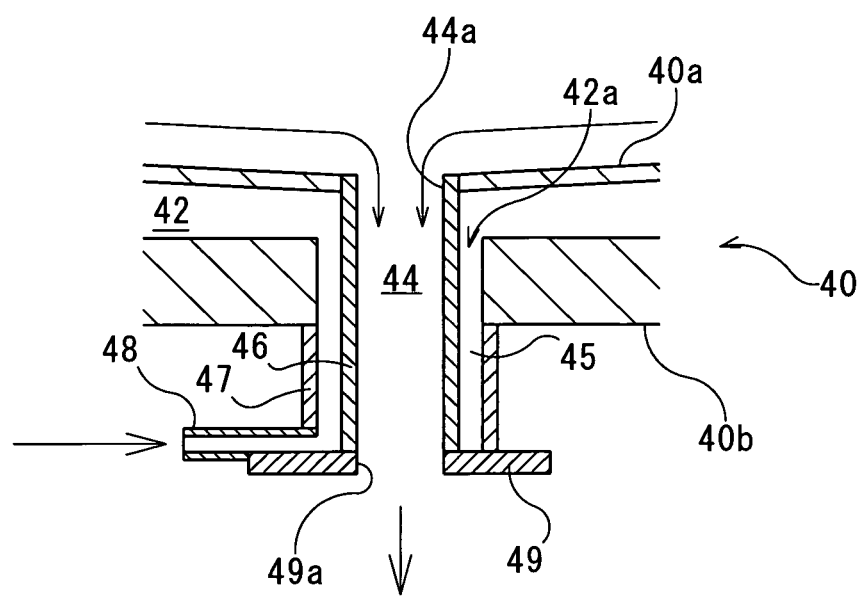
FIG. 5 is a sectional view showing the vicinity of the path of the bottom plate while clearing the upper surface of the bottom plate in the polycrystalline silicon reactor of FIG. 1.

As shown in FIG. 5, when the plug 50 is not attached to the opening 44a, the path 44 can open at the lowest part of the inclined upper surface 40a. On the protruded portion 52 of the plug 50, a part for rotating the plug 50 by a wrench or the like (e.g., a head part 53 having two parallel faces as illustrated) is formed.

The path 44 is, as shown in FIG. 4 and FIG. 5, formed by an inner pipe 46 which is fixed to the bottom plate 40 so as to penetrates the bottom plate 40 vertically and to be open at the upper surface 40a. The path 44 (i.e., the inner pipe 46) is connected to the raw-material gas supply source 62. The raw-material gas can be supplied into the reactor 10 through the path 44. An outer pipe 47 into which the inner pipe 46 is inserted coaxially is fixed to the lower surface 40b of the bottom plate 40. A cylindrical coolant path 45 is formed between the outer pipe 47 and the inner pipe 46. An upper end of the coolant path 45 is a water supply-port 42a which is open to the floor space 42 in a ring-shape.

The lower ends of the inner pipe 46 and the outer pipe 47 are fixed to a flange 49 closing the lower end of the cylindrical coolant path 45. The flange 49 is fixed to a coolant pipe 48 continuous to the coolant path 45 and extending outside. The flange 49 has a through hole 49a continuous to the path 44, and is a connecting joint which connects the path 44 to an external pipe 60.

That is, the coolant path 45 supplying the coolant to the floor space 42 is provided around the outer circumference of the path 44, thereby cooling the path 44. Therefore, contaminations from the path 44 can be prevented.

As shown in FIG. 1, the outer pipe 60 is constructed so as to have two channel of a drain pipe 60A which is opened and closed by a valve 60a, and a gas pipe 60B of the raw-material gas supply source 62 in which the gas supply can be closed by a valve 60b. By opening and closing the valves 60a, 60b appropriately, the path 44 can be alternated between supplying the raw-material gas to the reactor 10 and discharging the water to outside the reactor 10.

The reaction process using the polycrystalline silicon reactor 10 and the cleaning of the reactor 10 after the reaction process will be described.

As shown in FIG. 3 and FIG. 4, during the reaction process, the plug 50 is attached to the opening 44a of the path 44 which is open at the bottom plate 40. By closing the valve 60a and opening the valve 60b, the path 44 functions as a supplying path of the raw-material gas from the raw-material gas supply source 62. When the raw-material gas is supplied into the reactor 10 through the through hole 50a of the plug 50 and the ejection nozzles 12, on high-temperature surfaces of the silicon seed rods 20 and the connecting members 24 by the electricity, polycrystalline silicon is deposited. During the reaction process, since the inner surfaces of the bell jar 30 and the bottom plate 40 are cooled, the deposition of the polycrystalline silicon on the inner surfaces is prevented; on the other hand, reaction by-products "A" including chlorosilane polymer and the like are apt to be generated on the inner surface of the reactor 10.

Figure 2:
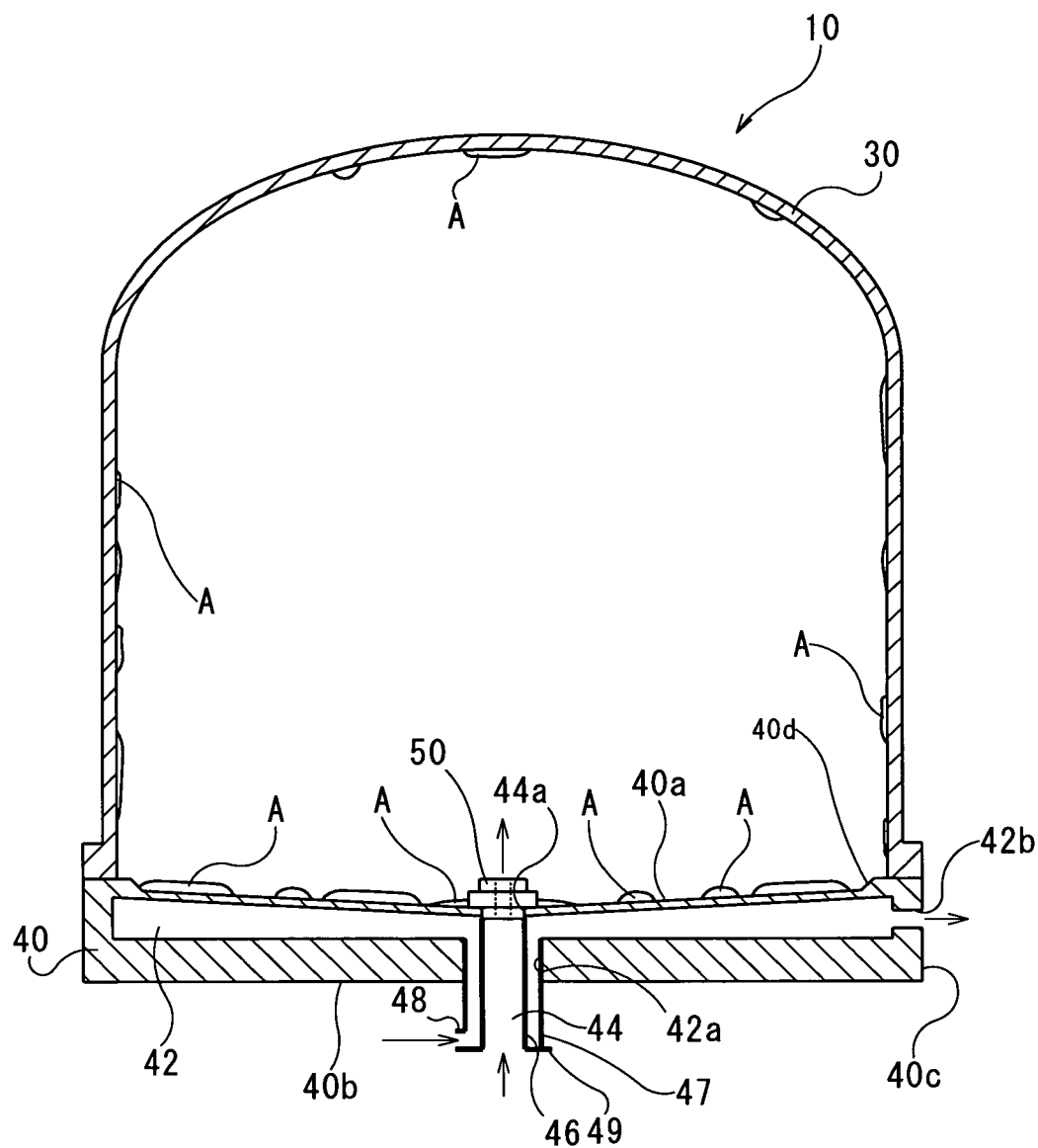
FIG. 2 is a vertical sectional view showing the polycrystalline silicon reactor of FIG. 1.

The upper surface 40a of the bottom plate 40 in the reactor 10 is depressed so as to be dished. Therefore, the fluid by-products "A" and the like of the reaction can flow toward the lowest part of the upper surface 40a along the inclined surface. The plug 50 is attached to the lowest part of the upper surface 40a so that the protruded part 52 is protruded from the upper surface 40a, and the upper surface 52a of the protruded part 52 is higher than the upper end of the sloped annular portion 40d standing at the outer peripheral part of the bottom plate 40. Therefore, the path 44 is open on the upper surface 52a of the protruded part 52. As a result, as shown in FIG. 2, even if flowing along the inclined surface of the upper surface 40a, the by-products A is stemmed in the step between the upper surface 40a and the protruded part 52, so that the by-products A does not flow into the path 44, i.e., the supply route of the raw-material gas. In addition, since the sloped annular portion 40d is provided, the thermal influence of the radiation heat of the reaction to a gasket sealing the bell jar 30 to the bottom plate 40 can be reduced.

During the reaction process, since the plug 50 is attached to the bottom plate 40 and protruded into the reactor 10, so the plug 50 is exposed to high temperature by the radiation heat of the electrode units 22. However, since the coolant flows in the bottom plate 40 and the raw-material gas flows in the through hole 50a of the plug 50 through the path 44, the temperature is reduced, so that the plug 50 does not become high-temperature state excessively. As a result, even though the plug 50 is made of carbon having high thermal conductivity and is easy to transfer the temperature, the plug 50 is not heated more than necessary and the bottom plate 40 and the inner pipe 46 is not heated excessively. Therefore, since the silicon is prevented from depositing in the through hole 50a, the raw-material gas can flow in the through hole 50a, so that the raw-material gas can be stably supplied.

After the reaction process is ended, before the bell jar 30 is disassembled for recovering the deposited polycrystalline silicon, the inner of the reactor 10 is filled with inert gas, and an operation for deactivating the polymers included in the reaction by-products A is executed. Silica powder and the like which are generated by deactivating the polymers are adhered also to the upper surface 40a of the bottom plate 40. When the reaction process terminates, the valve 60b is closed, so that the raw-material gas is not supplied through the path 44.

After the completion of the replacement of the atmosphere and the inactivation process, the bell-jar 30 is dismounted from the bottom plate 40, and the polycrystalline silicon is recovered. In a state in which the plug 50 is still attached to the bottom plate 40, the water is supplied to the upper surface 40a and impounded there for a while. Consequently, the polymers which are adhered to the bottom plate 40 are easy to be removed since the polymers are hydrolyzed by the water. Accordingly, the accretions are peeled off from the upper surface 40a by a cleaning tool, and removed from the bottom plate 40. That is, the plug 50 is detached from the path 44 and the valve 60a is opened, as shown in FIG. 5, the opening 44a of the path 44 is open at the lowest part of the upper surface 40a. As a result, the water and the accretions are streamed on the bottom plate 40, and discharged through the path 44. The path 44 functions as a discharging port of the water during the cleaning. Note, it is possible to peel off the accretions by the cleaning tool in a state in which the plug 50 is detached and the water flows on the upper surface 40a.

That is, the water which is supplied on the bottom plate 40 is not overflowed from the bottom plate 40 by the sloped annular portion 40*d* and the plug 50, and hydrolyze the polymers. Consequently, if the plug 50 is detached, the water cleans the upper surface 44*a* while flowing along the inclined surface of the upper surface 40*a* toward the opening 44*a*, and then is discharged to the outside of the reactor 10 from the path 44 through the drain pipe 60A.

In addition, the plug 50 for the reaction process is made of carbon, so that the plug 50 can be reused after a purifying process. However, if cleaning the reactor 10 with attaching the plug 50, it is apprehended that the purifying process would be prevented since the water sops into the carbon plug 50. Therefore, when cleaning the reactor 10, it is preferable that the carbon plug 50 be detached before supplying the water and be replaced to a plug for the cleaning process. By using the other plug for the cleaning process than the plug 50 for the reaction process, the plug 50 can be surely purified, so that a contamination by the plug 50 can be prevented.

As described above, the polycrystalline silicon reactor 10 is provided so that the upper surface 40*a* of the bottom plate 40 is formed in the recessed shape, and is provided with the plug 50 which is detachably attached to the path 44 of the lowest part of the upper surface 40*a* of the bottom plate 40. Therefore, during the reaction process, the plug 50 having the protruded part 52 is attached to the path 44, thereby preventing the by-products A, polycrystalline silicon and the like from flowing into the path 44 for supplying the raw-material gas into the reactor 10. When cleaning the upper surface 40*a* of the bottom plate 40, the plug 50 is detached from the path 44, so that the path 44 is open at the lowest part of the upper surface, then the water which cleaned the upper surface 40*a* can be smoothly discharged from the path 44.

The invention is not limited to the embodiments, and various modifications can be made without departing from the scope of the invention.

The invention claimed is:

1. A polycrystalline silicon reactor in which the polycrystalline silicon is deposited by supplying raw-material gas to a heated silicon seed rod comprising:

a bottom plate on which the silicon seed rod stands, having a dished upper surface formed in a recessed shape so as to descend toward a center thereof;

an opening of a path penetrating the bottom plate from the upper surface to a lower surface, being provided at a lowest part of the upper surface; and a plug which is detachably attached to the opening.

2. The polycrystalline silicon reactor according to claim 1, wherein the plug has a protruded portion which protrudes from the upper surface of the bottom plate, and a through hole which opens at an upper surface of the protruded portion and connects the path to an inner of the reactor.

3. The polycrystalline silicon reactor according to claim 2, wherein a sloped annular portion which is higher than the upper surface of the bottom plate is provided at an outer peripheral part of the bottom plate along a circumferential direction, and the plug is formed so that the upper surface of the protruded portion is higher at least than a top end of the sloped annular portion in a state in which the plug is attached to the opening.

4. The polycrystalline silicon reactor according to claim 1, wherein the plug is made of carbon.

5. The polycrystalline silicon reactor according to claim 2, wherein the path is connected to a raw-material gas supply source which supplies the raw-material gas.

6. The polycrystalline silicon reactor according to claim 1, wherein a sloped annular portion which is higher than the upper surface of the bottom plate is provided at an outer peripheral part of the bottom plate along a circumferential direction.

7. The polycrystalline silicon reactor according to claim 1, further comprising a cylindrical coolant path surrounding an outer peripheral of the path.

* * * * *